(12) United States Patent
Ozawa

(10) Patent No.: US 6,545,867 B2
(45) Date of Patent: Apr. 8, 2003

(54) THERMAL-RESISTANCE VARIABLE HEAT SINK STRUCTURE AND METHOD OF USING THE SAME

(75) Inventor: Tadashi Ozawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/819,609

(22) Filed: Mar. 29, 2001

(65) Prior Publication Data

US 2001/0053062 A1 Dec. 20, 2001

(30) Foreign Application Priority Data

Jun. 14, 2000 (JP) .................................... 2000-177715

(51) Int. Cl.⁷ ................................................ H05K 7/20
(52) U.S. Cl. ...................... 361/703; 257/722; 165/80.3; 165/185; 361/790; 361/704; 174/16.3
(58) Field of Search ................ 165/80.3, 185, 165/121–126; 174/16.3; 257/722; 361/690, 694–695, 703, 704, 707, 715; 454/184

(56) References Cited

U.S. PATENT DOCUMENTS

| | | | | |
|---|---|---|---|---|
| 5,077,601 A | * | 12/1991 | Hatada et al. | 361/695 |
| 5,563,768 A | * | 10/1996 | Perdue | 361/695 |
| 6,330,157 B1 | * | 12/2001 | Bezama et al. | 361/704 |

* cited by examiner

*Primary Examiner*—Gregory Thompson
(74) *Attorney, Agent, or Firm*—Sughrue Mion, PLLC

(57) ABSTRACT

A thermal resistance variable heat sink structure is provided that can improve the quality during operation and that can change the shape of a heat sink and reduce the number of steps attaching and detaching. Solder balls 1 are disposed for connection of a LSI 2. A mounting plate 3 on which a heat sink is mounted, screws 4 for mounting the heat sink, a radiation fin 5, and a thermal resistance adjuster 6 are disposed on the back surface of the LSI 2. The thermal resistance adjuster 6 is placed on the middle of the back surface to cut the cooling air.

26 Claims, 9 Drawing Sheets

THERMAL-RESISTANCE VARIABLE HEAT SINK STRUCTURE AND METHOD OF USING THE SAME

BACKGROUND OF THE INVENTION

The present invention relates to a thermal-resistance variable heat sink structure and to a method of using the same. Particularly, the present invention relates to a technique of screening chips.

In large-scale computers or the like, the so-called chip set where plural LSIs (large-scale integrated circuits) are mounted on the same board has generally used to realize predetermined functions. When the function of an LSI is realized, a high-dense chip results in larger power consumption, whereas a low-dense chip results in lower power consumption.

The high-dense chip consumes larger power, thus generating a larger heat amount. For that reason, a heat sink or a cooling fan is attached to the chip to cool the chip, thus stabilizing the performance of the chip itself.

In the shipment of a chip, whether or not the chip achieves predetermined functions is judged using an automatic IC (integrated circuit) tester. Thus, the screening is carried out to sort defective items and accepted items.

Conventionally, chips are basically subjected to the DC screening in which a constant voltage is applied to them before the shipment. However, the qualities of chips are not often maintained. Hence, the AC screening (reinforced screening) is required to increase the power consumption after chips are mounted on a board. In this case, the AC screening can be realized by modifying the heat sink structure. However, this approach has not been practically because of a large number of man-hours.

SUMMARY OF THE INVENTION

The present invention is made to solve the above-mentioned problems. An object of the present invention is to provide a thermal-resistance variable heat sink structure that can improve the quality at a working time and can change the shape of a heat sink and reduce the number of steps for attaching or detaching.

Another object of the present invention is to provide the method of using the above-mentioned heat sink structure.

According to the present invention, a thermal-resistance variable heat sink structure comprises a thermal resistance adjuster disposed on a heat sink to cool an integrated circuit device. The thermal resistance adjuster has a thermal resistance equal to or more than that of a material for the heat sink.

Moreover, in a method of using a thermal-resistance variable heat sink structure, according to the present invention, the method comprises the steps of using a thermal resistance adjuster in a factory inspection and then disassembling the thermal resistance adjuster in shipment. The thermal resistance adjuster is disposed on a heat sink to cool an integrated circuit device and is formed of a material having a thermal resistance equal to or more than that of the heat sink.

That is, in the thermal-resistance variable heat sink structure of the present invention, a thermal resistance adjuster (comb-like plate), which utilizes air blocking function, is mounted on a slit-like heat sink to realize a low thermal resistance. The thermal resistance adjuster is formed of a material having a thermal resistance larger than that of the heat sink.

In the heat sink structure, a thermal-resistance variable heat sink is used for low-power LSIs among many LSIs mounted on a board. Thus, the screening is performed by accelerating the premature failure while the junction temperature of the low-power LSI is set to the same value as that of a high-power LSI.

That approach allows the ambient temperature about LSIs mounted on a board to be fixed. Hence, the screening can be carried out with increased junction temperatures of low power LSIs with low integration density.

Moreover, products that are nearly defective can be initially rejected at the fabrication step. As a result, the quality of an LSI at an operational time can be improved. It is possible to change the structure of a heat sink and to reduce the number of attaching and detaching steps.

BRIEF DESCRIPTION OF THE DRAWINGS

This and other objects, features and advantages of the present invention will become more apparent upon a reading of the following detailed description and drawings, in which.

DESCRIPTION OF THE EMBODIMENTS

Figure 1:
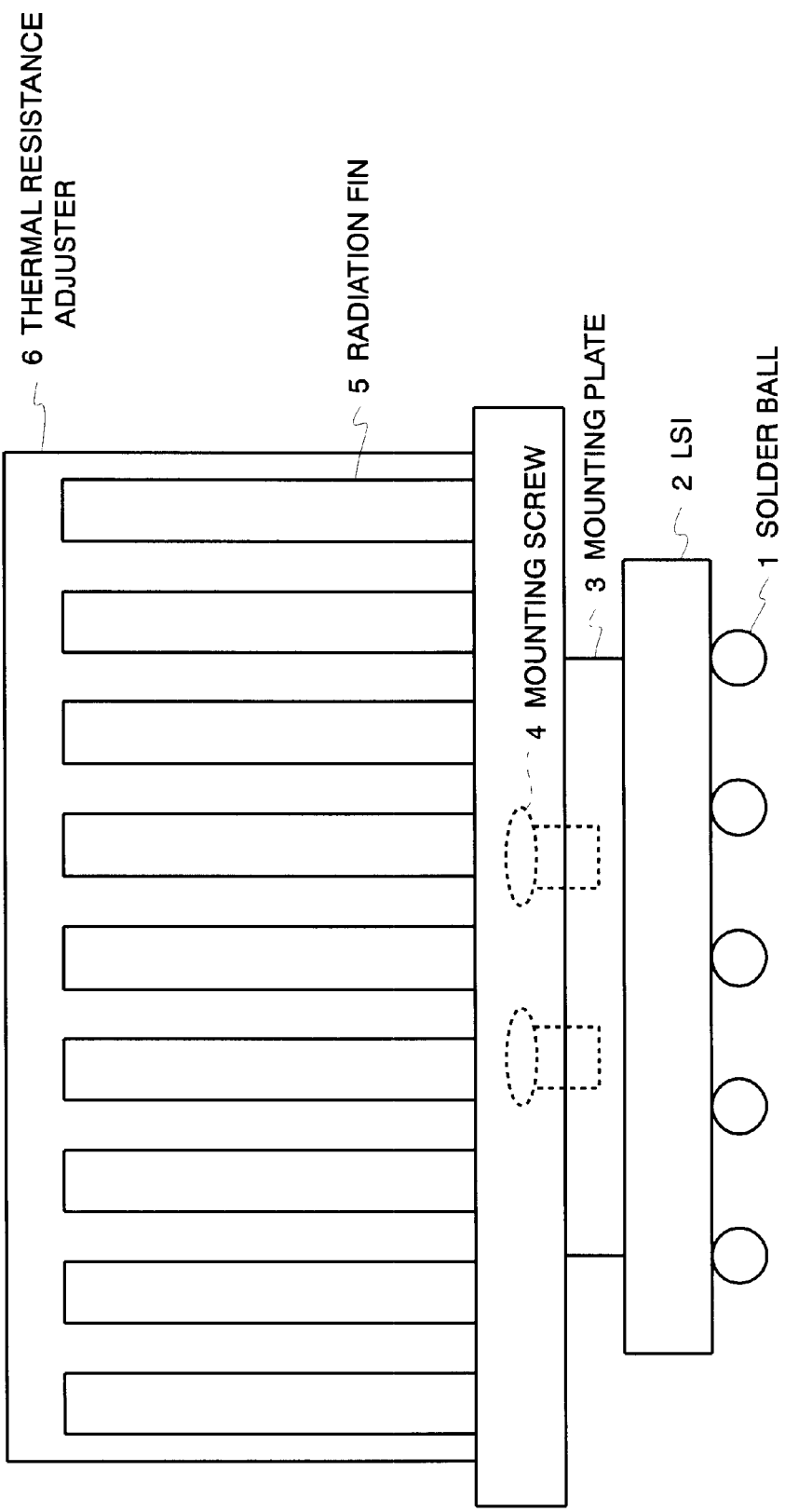
FIG. 1 is a front view illustrating a semiconductor integrated circuit device according to an embodiment of the present invention.
Figure 2:
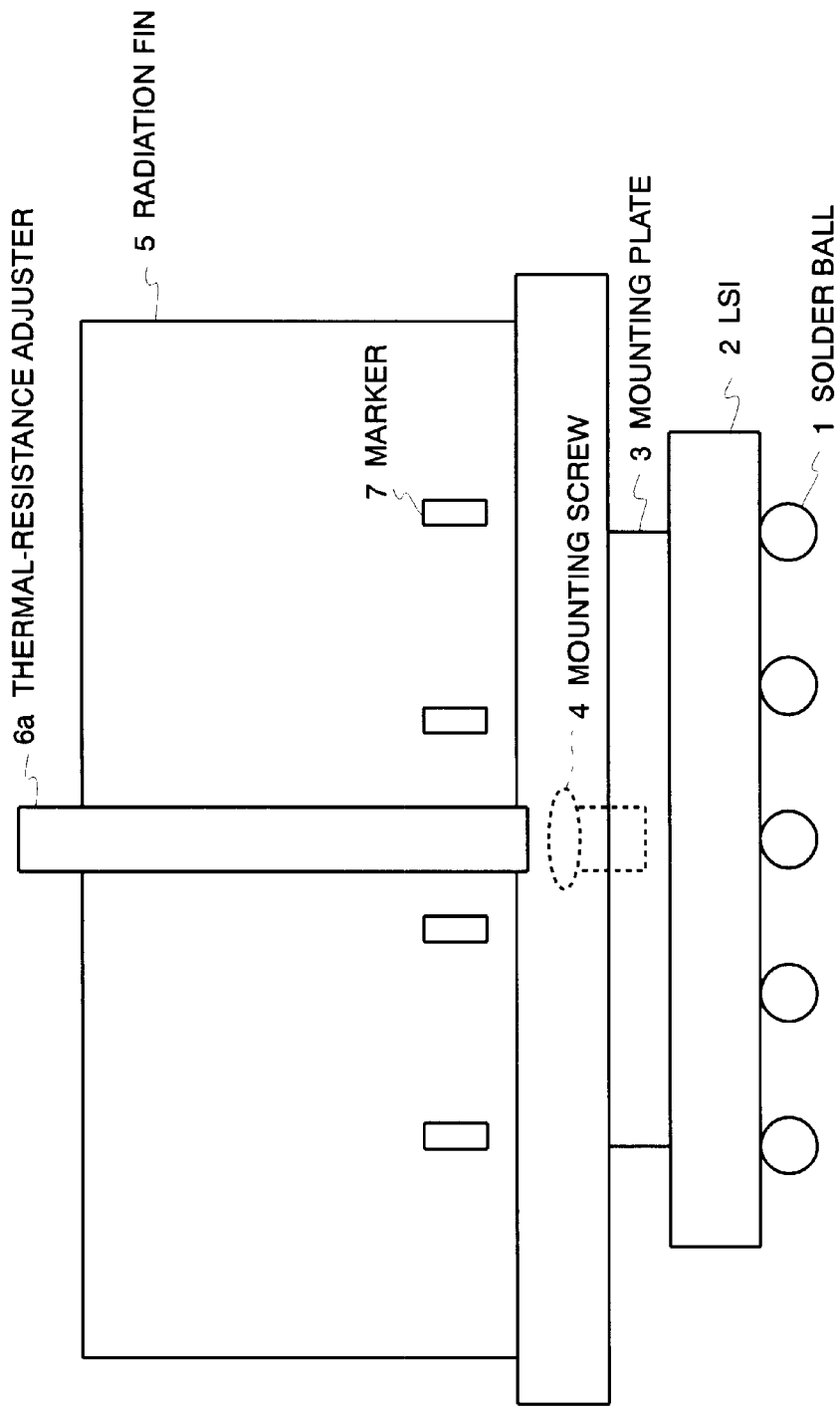
FIG. 2 is a side view illustrating a semiconductor integrated circuit device according to an embodiment of the present invention.

Embodiments of the present invention will be described below by referring to the attached drawings. FIG. 1 is a front view illustrating a semiconductor integrated circuit device according to an embodiment of the present invention. FIG. 2 is a side view illustrating a semiconductor integrated circuit device according to an embodiment of the present invention. Referring to FIGS. 1 and 2, a semiconductor integrated circuit device includes solder balls 1, a semiconductor integrated circuit device (LSI) 2, a mounting plate 3, mounting screws 4, radiation fins 5, a thermal resistance adjuster 6, and a marker 7. The marker 7 indicates a place where a predetermined thermal resistance is obtained.

The thermal resistance adjuster 6 is placed on a heat sink (formed of plural radiation fins 5) to cool the LSI 2. The thermal resistance adjuster 6 is formed of a material having a thermal resistance equal to or more than that of the heat sink. The thermal resistance adjuster 6, not mounted on the heat sink, indicates a lowest thermal resistance. The thermal resistance adjuster 6, mounted on the heat sink, analogously varies its thermal resistance.

The thermal resistance adjuster 6, shaped in a plate form, is mounted perpendicularly to the radiation fin 5. In other words, the thermal resistance adjuster 6 is mounted on the radiation fin 5 so as to cut the cooling air toward the LSI 2. The position where the thermal resistance adjuster 6 is mounted on the radiation fin 5 varies in the same direction as that of the cooling air. The heat sink is formed of radiation fins 5 arranged in a slit-like form to realize the low thermal resistance.

FIG. 2 shows an example of a semiconductor integrated circuit device with a high thermal resistance. Specifically, the thermal resistance adjuster 6a, which blocks the air, is mounted on the middle of the radiation fin 5 forming a heat sink. Markers 7, showing a reference thermal resistance, are provided on the outer radiation fins 5.

Figure 3:
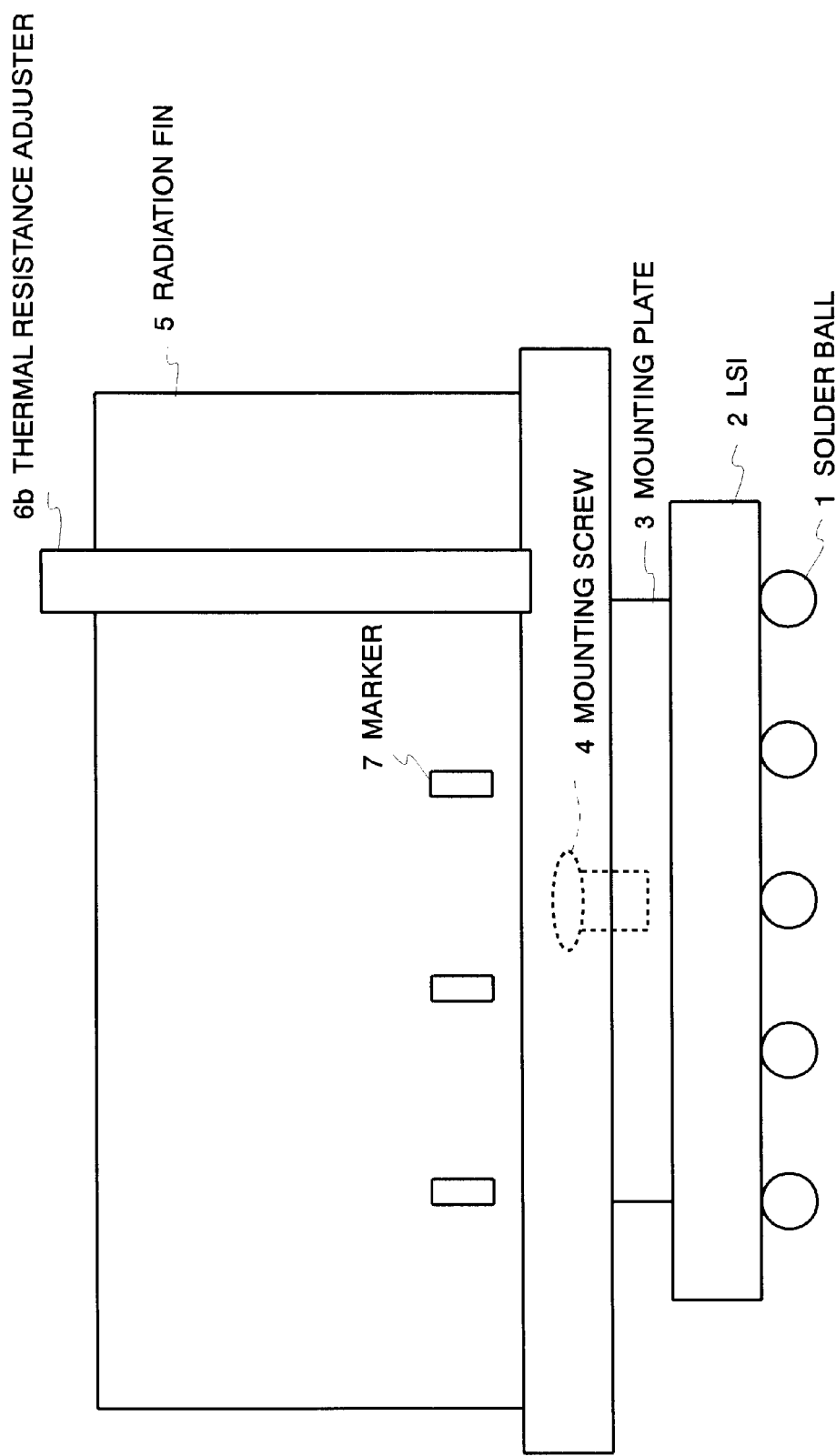
FIG. 3 is a side view illustrating a semiconductor integrated circuit device with a reduced thermal resistance, according to an embodiment of the present invention.

FIG. 3 is a side view illustrating a semiconductor integrated circuit device with a reduced thermal resistance. Referring to FIG. 3, the thermal resistance adjuster 6b is mounted on the rear end of the radiation fin 5.

In the example shown in FIG. 3, markers 7, showing a reference thermal resistance, are provided on the outer radiation fin 5, in a manner similar to that shown in FIG. 2. The heat sink structure (not shown) indicates a lowest thermal resistance when the thermal resistance adjuster 6b is not used.

The heat sink structure for a semiconductor integrated circuit device, according to an embodiment of the present invention, will be described below by referring to FIGS. 1 to 3.

Generally, the junction temperature (Tj) of a LSI is one factor determining the reliability of the LSI. The temperature Tj is expressed by the following formula:

$$Tj=Ta+Pd*R\theta$$

where Ta (° C.) is an ambient temperature, Pd(W) is a power consumption, and $R\theta$(° C./W) is a thermal resistance.

The power consumption Pd becomes larger in high dense products. The ambient temperature generally ranges 25° C. to 30° C. In order to suppress the junction temperature to a certain value or less, a radiation structure having a low thermal resistance $R\theta$ is generally used.

Since the power consumption Pd of low dense LSIs is small, the junction temperature Tj is low. The structure in which LSIs are mounted on the same board provides a small screening effect. In the heat sink structure for a semiconductor integrated circuit device, according to an embodiment of the present invention, the thermal resistance $R\theta$ is simply changed so that the screening effect is improved.

FIG. 1 shows a heat sink structure viewed from the direction where the cooling air blows. Solder balls 1 are disposed for connection of the LSI 2. A mounting plate 3 for mounting a heat sink, screws 4 for mounting the heat sink, a radiation fin 5, and a thermal resistance adjuster 6 are piled up on the back side of the LSI 2.

FIG. 2 shows the heat sink structure viewed from the side surface thereof. The thermal resistance adjuster 6a is disposed on the middle of the heat sink structure and has the structure of blocking the cooling air. For example, the thermal resistance adjuster 6a is formed of aluminum. The thermal resistance adjuster 6a is a 4 cm×4 cm cube and has a 1 mm-thick fin. In the case of the wind velocity of 2 m/S, a heat sink with a 3 mm pitch and with no thermal resistance adjuster 6a has a thermal resistance of 2 to 3° C./W.

In the structure shown in FIG. 2, the thermal resistance of the heat sink is 5 to 6° C./W. This means that even a half power consumption, compared with the LSI with a maximum power consumption, results in the same junction Tj.

Similarly, FIG. 3 shows the structure in which the thermal resistance adjuster 6b is moved to the opposite end. It is already known that the thermal resistance of the heat sink is 5 to 6° C./W. With no thermal resistance adjuster, the thermal resistance of the heat sink is 2 to 4° C./W. The movement of the thermal resistance adjuster 6b allows the thermal resistance $R\theta$ of the heat sink to be changed. In this case, the dependency on place of the thermal resistance adjuster 6b is measured in advance. Thus, the marker 7 is denoted in advance.

In a manufacture and inspection in a factory, the thermal resistance adjuster 6 is mounted on the heat sink and the LSI is subjected to an accelerating test, with the junction temperature Tj increased. After a completion of the inspection, the thermal resistance adjuster 6 is dismounted for shipment. This feature allows the heat sink structure to be minimized. Since it is not necessary to remove the LSI from the heat sink, the screening can be effectively performed.

Figure 4:
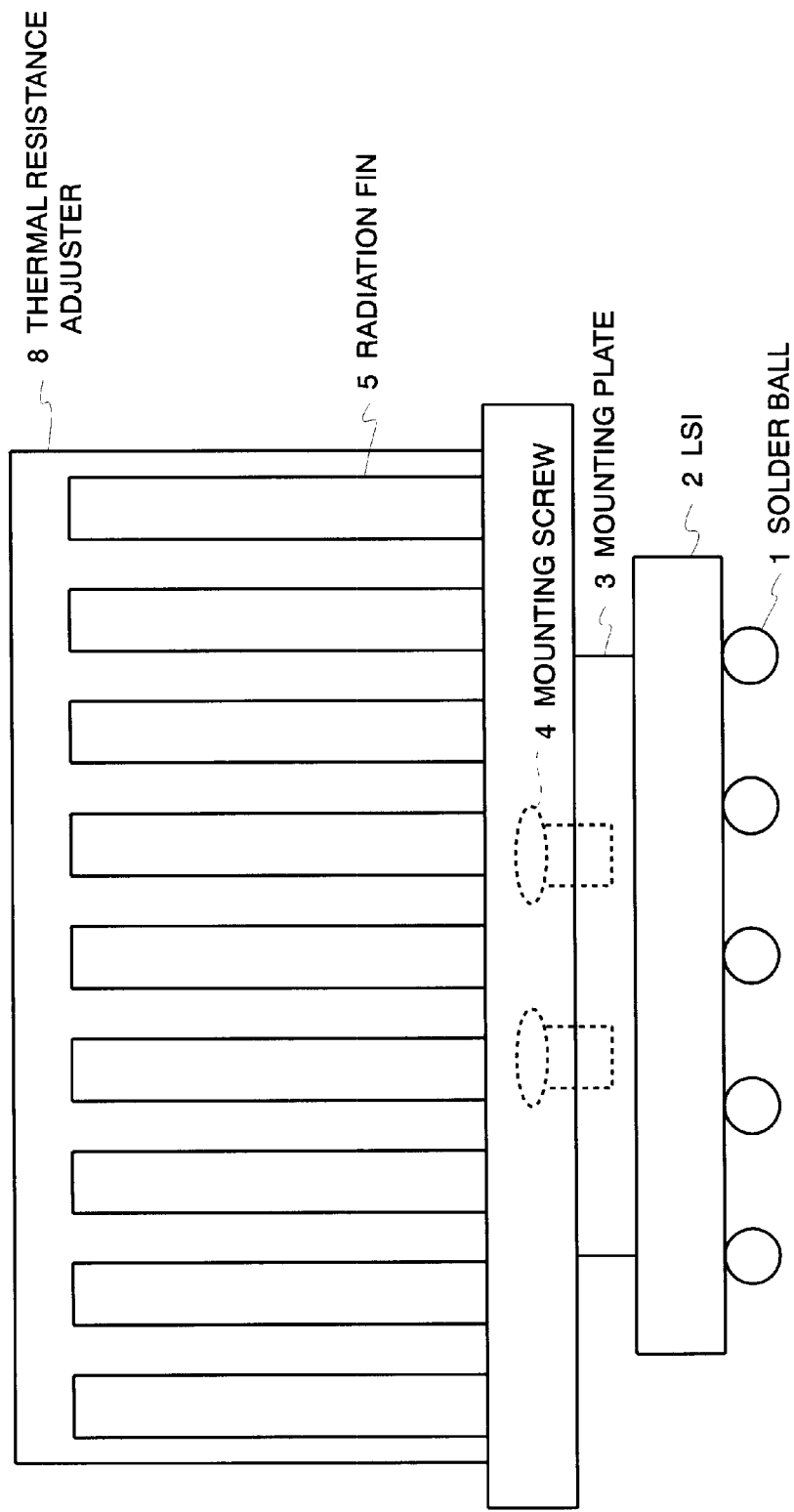
FIG. 4 is a front view illustrating a semiconductor integrated circuit device according to another embodiment of the present invention.
Figure 5:
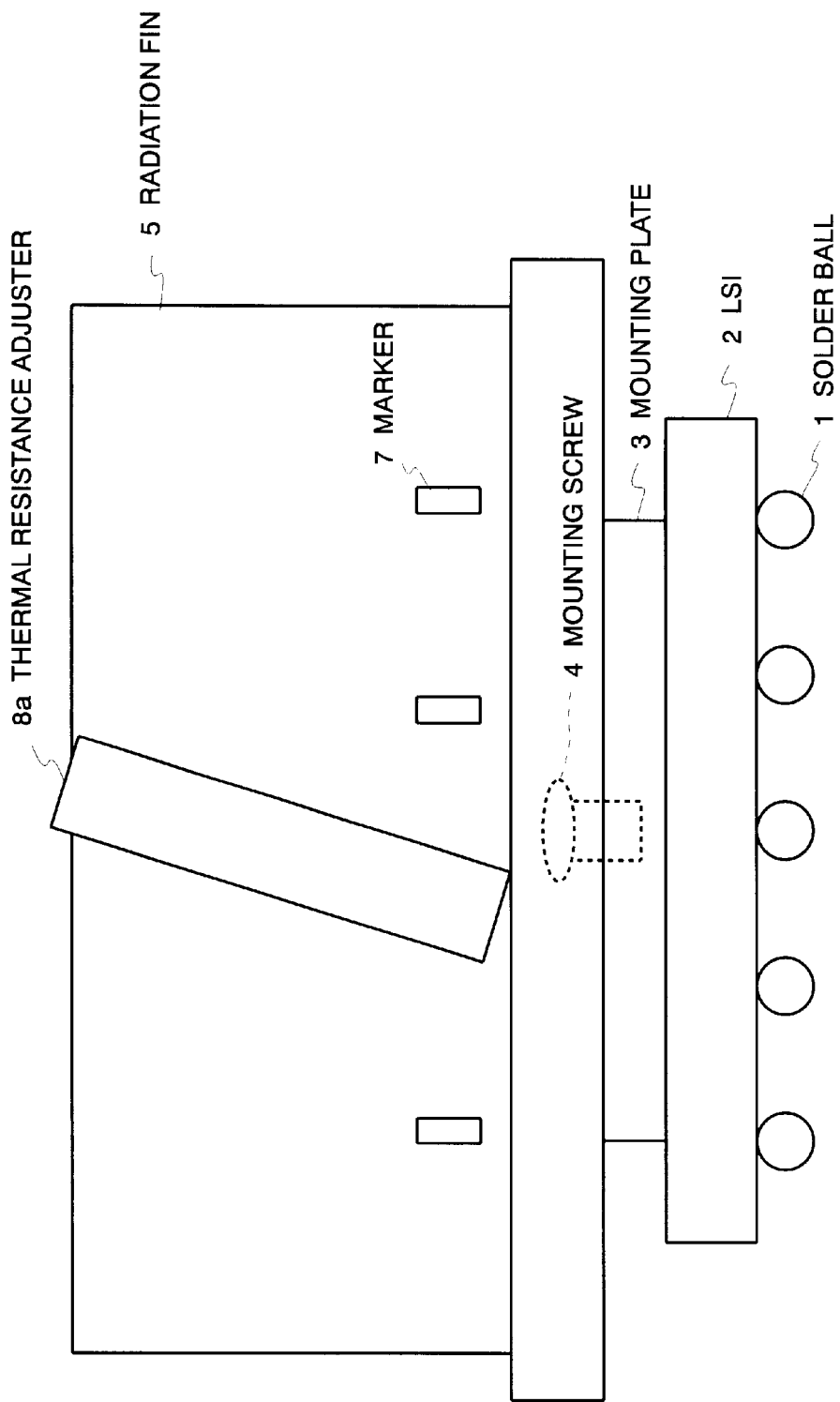
FIG. 5 is a side view illustrating a semiconductor integrated circuit device according to another embodiment of the present invention.

FIG. 4 is a front view illustrating a semiconductor integrated circuit device according to another embodiment of the present invention. FIG. 5 is a side view illustrating a semiconductor integrated circuit device according to another embodiment of the present invention. FIGS. 4 and 5 show an example of a semiconductor integrated circuit device with an increased thermal resistance.

Referring to FIGS. 4 and 5, the thermal resistance adjuster 8a is slantingly mounted on the middle of the radiation fin 5. Such a structure allows the cooling air to be smoothly flown.

Figure 6:
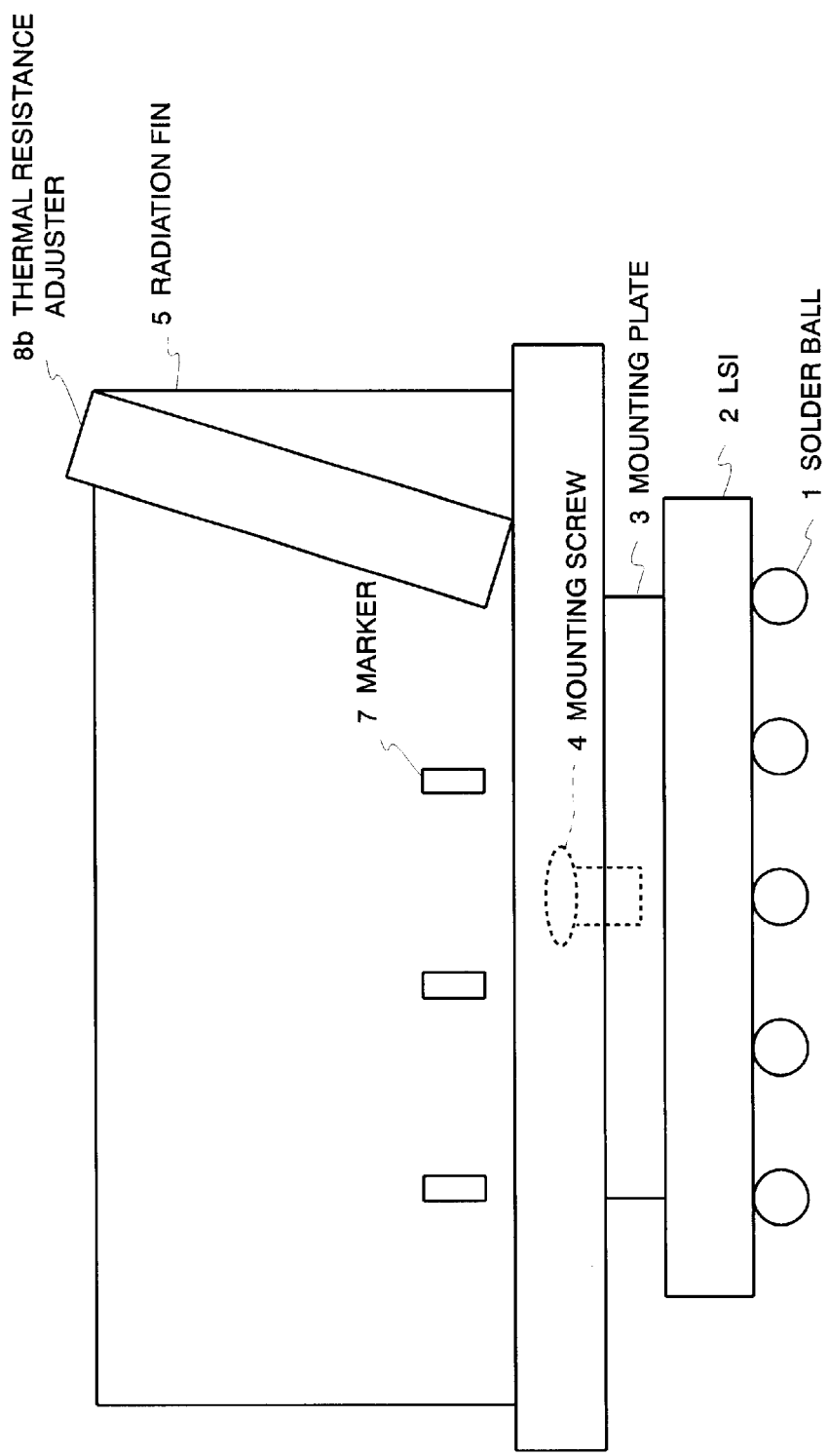
FIG. 6 is a side view illustrating a semiconductor integrated circuit device with a reduced heat resistance, according to another embodiment of the present invention.

FIG. 6 is a side view illustrating an example of a semiconductor integrated circuit device with a reduced thermal resistance, according to another embodiment of the present invention. Referring to FIG. 6, the thermal resistance adjuster 8b is slantingly mounted on the rear end of the radiation fin 5.

Figure 7:
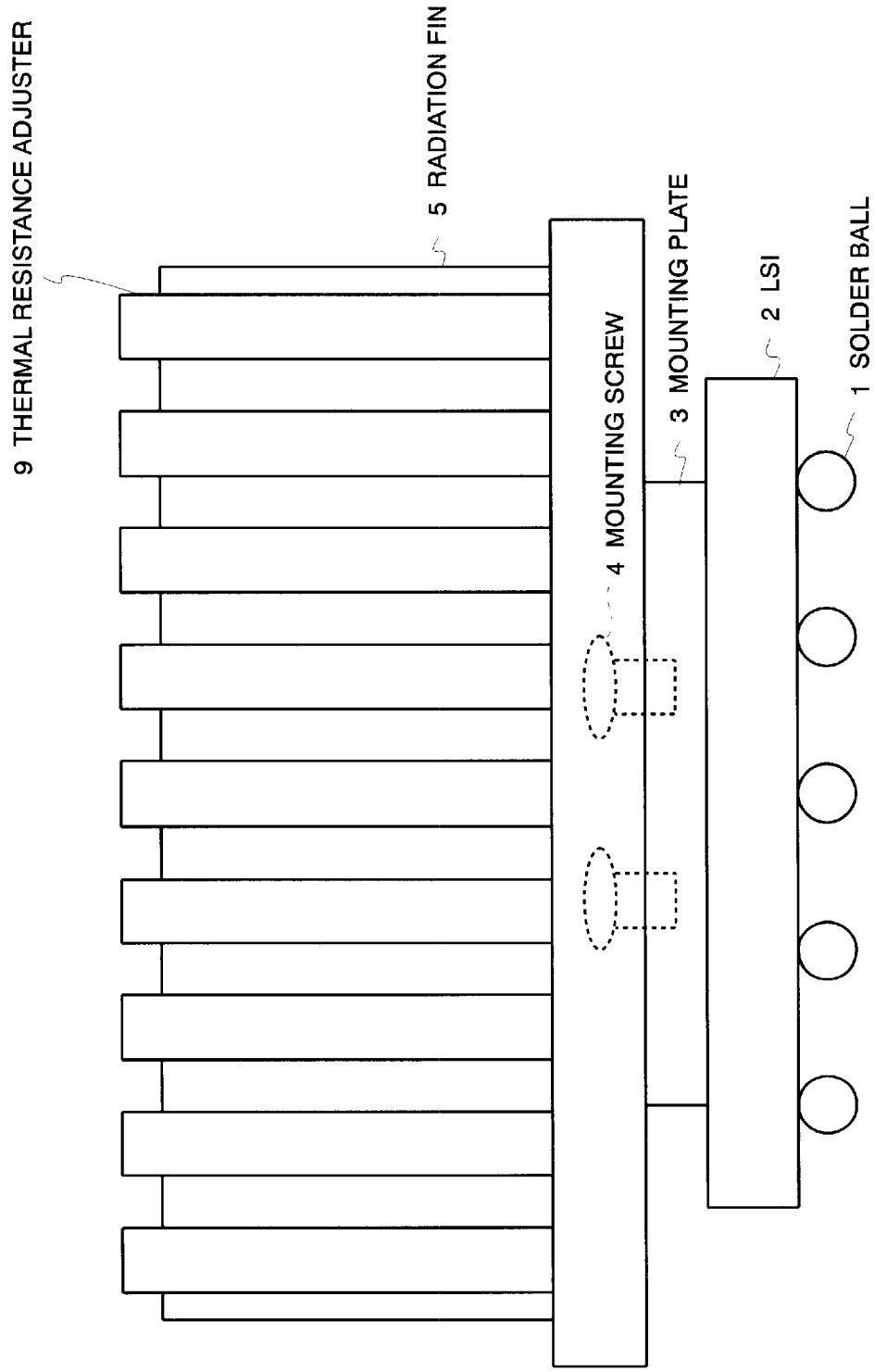
FIG. 7 is a front view illustrating a semiconductor integrated circuit device according to further another embodiment of the present invention.
Figure 8:
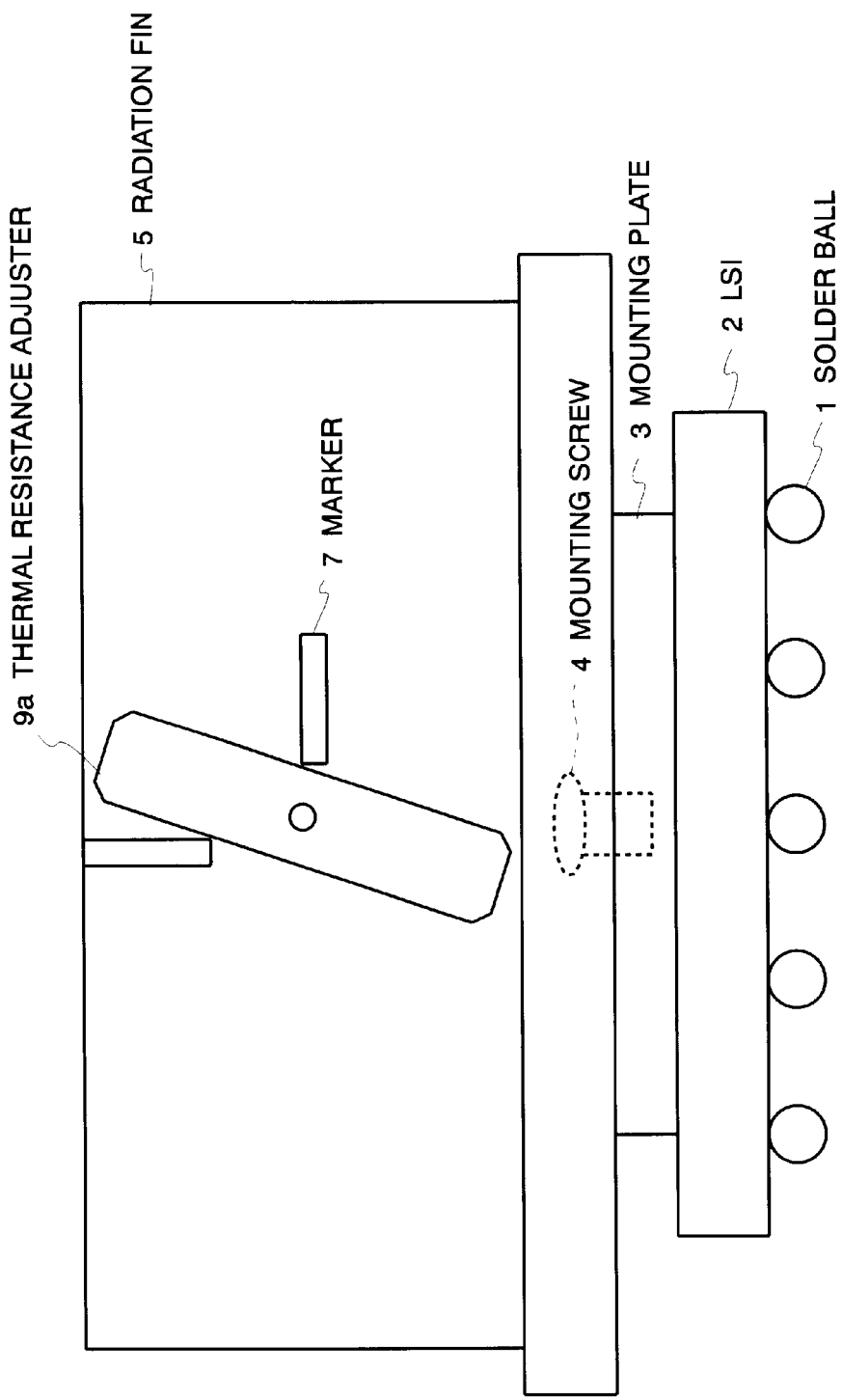
FIG. 8 is a side view illustrating a semiconductor integrated circuit device according to further another embodiment of the present invention.

FIG. 7 is a front view illustrating a semiconductor integrated circuit device according to another embodiment of the present invention. FIG. 8 is a side view illustrating a semiconductor integrated circuit device according to another embodiment of the present invention. FIGS. 7 and 8 show an example of a high thermal resistance, with the air blocked. Referring to FIG. 8, the thermal resistance adjuster 9a is rotatably mounted on the middle of the heat dissipation so as to vary the angle thereof.

Figure 9:
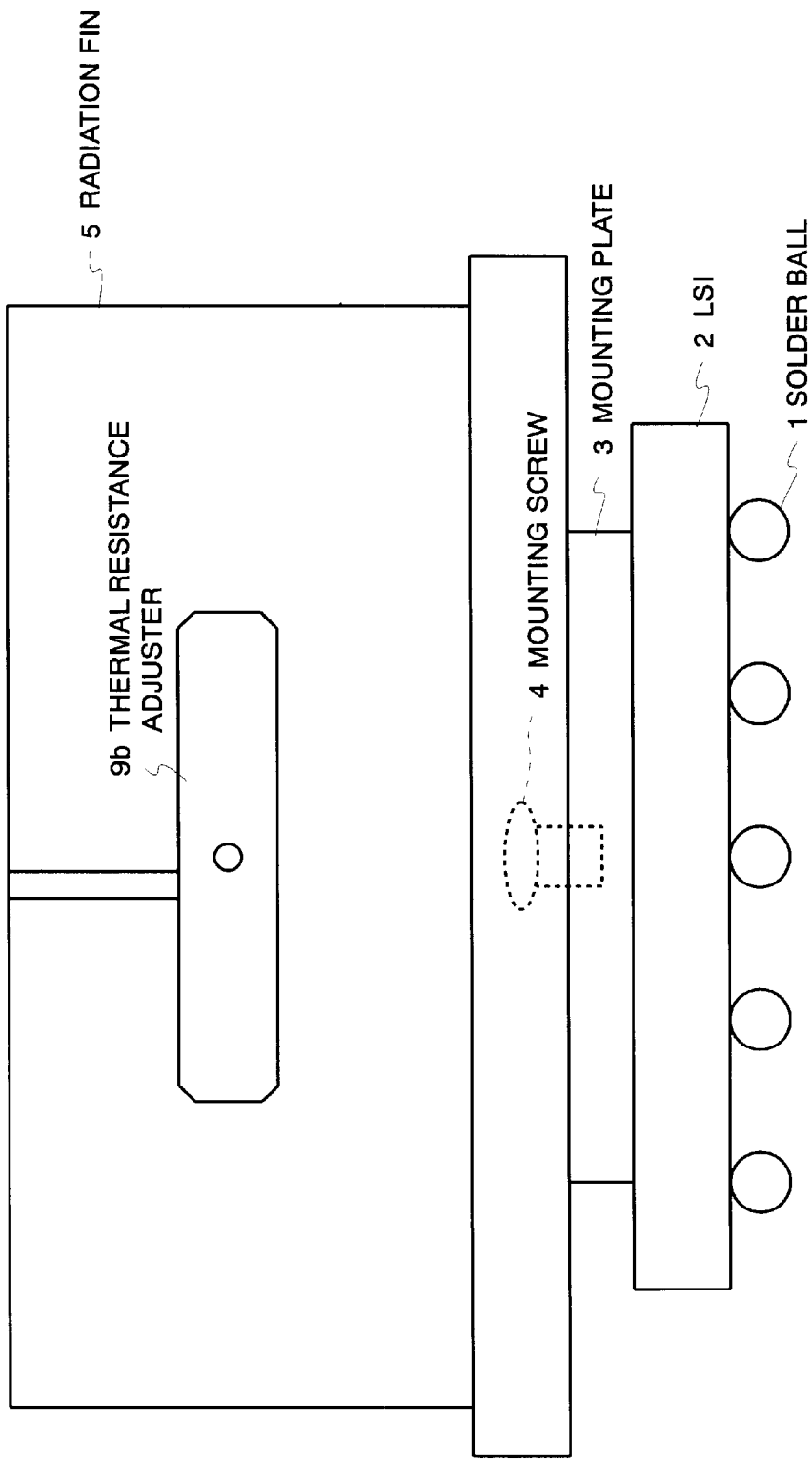
FIG. 9 is a side view illustrating a semiconductor integrated circuit device with a reduced heat resistance, according to further another embodiment of the present invention.

FIG. 9 is a side view illustrating a semiconductor integrated circuit device with a low thermal resistance, according to another embodiment of the present invention. Referring to FIG. 9, the thermal resistance adjuster 9b attached on the middle of the radiation fin 5 is rotated to a horizontal level.

Since a LSI mounted on a board is fixed at the ambient temperature Ta, the screening can be performed with increased junction temperature of a low-dense, small power LSI.

According to the present invention, an item that is nearly defective can be initially rejected in a fabrication process so that the quality of the item at a working time can be improved. Moreover, the present invention can change the shape of the heat sink and can reduce the number of steps of attaching and detaching.

As described above, according to the present invention, the thermal resistance adjuster is mounted on the heat sink to cool an integrated circuit device and is a material having a thermal resistance equal to or more than that of the heat sink. Since the thermal resistance adjuster is used at a factory inspection and then removed in shipment, the quality of an item at a working time can be improved. Moreover, the present invention has the advantage of capable of changing the shape of a heat sink and reducing the number of steps of attaching and detaching.

The entire disclosure of Japanese Application No. 2000-177715 filed on Jun. 14, 2000 including specification, claims, drawings and summary are incorporated herein by reference in its entirely.

What is claimed is:

1. A thermal-resistance variable heat sink structure comprising a removable thermal resistance adjuster disposed on a heat sink to cool an integrated circuit device, said thermal resistance adjuster having a thermal resistance equal to or more than that of a material for said heat sink,
wherein said thermal resistance adjuster is mounted to a radiation fin so as to cut cooling air from said integrated circuit device, said radiation fin being shaped in a plate-like form and forming said heat sink, and said thermal resistance adjuster having a comb-like shape.

2. The thermal-resistance variable heat sink structure defined in claim 1, wherein said thermal resistance adjuster is mounted to said radiation fin so as to be variable in the blowing direction of said cooling air.

3. The thermal-resistance variable heat sink structure defined in claim 2, wherein said thermal resistance adjuster is mounted at a predetermined angle with respect to the mounting direction of said radiation fin.

4. The thermal-resistance variable heat sink structure defined in claim 2, wherein said heat sink includes a plurality of radiation fins and is shaped in a slit-like form to realize a low thermal resistance.

5. The thermal-resistance variable heat sink structure defined in claim 1, wherein said thermal resistance adjuster is mounted at a predetermined angle with respect to the mounting direction of said radiation fin.

6. The thermal-resistance variable heat sink structure defined in claim 1, wherein said heat sink includes a plurality of radiation fins and is shaped in a slit-like form to realize a low thermal resistance.

7. A thermal-resistance variable heat sink structure comprising a removable thermal resistance adjuster disposed on a heat sink to cool an integrated circuit device, said thermal resistance adjuster having a thermal resistance equal to or more than that of a material for said heat sink,
wherein said thermal resistance adjuster is mounted to a radiation fin so as to cut cooling air from said integrated circuit device, said radiation fin being shaped in a plate-like form and forming said heat sink, and
wherein said thermal resistance adjuster is mounted perpendicularly to a radiation surface of said radiation fin.

8. The thermal-resistance variable heat sink structure defined in claim 7, wherein said thermal resistance adjuster is mounted to said radiation fin so as to be variable in the blowing direction of said cooling air.

9. The thermal-resistance variable heat sink structure defined in claim 7, wherein said thermal resistance adjuster is mounted at a predetermined angle with respect to the mounting direction of said radiation fin.

10. The thermal-resistance variable heat sink structure defined in claim 7, wherein said heat sink includes a plurality of radiation fins and is shaped in a slit-like form to realize a low thermal resistance.

11. A thermal-resistance variable heat sink structure comprising a removable thermal resistance adjuster disposed on a heat sink to cool an integrated circuit device, said thermal resistance adjuster having a thermal resistance equal to or more than that of a material for said heat sink,
wherein said thermal resistance adjuster is mounted to a radiation fin so as to cut cooling air from said integrated circuit device, said radiation fin being shaped in a plate-like form and forming said heat sink,
wherein said thermal resistance adjuster is rotatably mounted on the middle portion of the radiation surface of said radiation fin.

12. A thermal-resistance variable heat sink structure comprising a removable thermal resistance adjuster disposed on a heat sink to cool an integrated circuit device, said thermal resistance adjuster having a thermal resistance equal to or more than that of a material for said heat sink, wherein said thermal resistance adjuster is rotatably mounted on the middle portion of the radiation surface of said radiation fin.

13. The thermal-resistance variable heat sink structure defined in claim 12, wherein said heat sink is shaped in a slit-like form to realize a low thermal resistance.

14. A method of using a thermal-resistance variable heat sink structure, said method comprising the steps of using a thermal resistance adjuster for an inspection and then disassembling said thermal resistance adjuster, said thermal resistance adjuster being disposed on a heat sink to cool an integrated circuit device, said thermal resistance adjuster being formed of a material having a thermal resistance equal to or more than that of said heat sink,
wherein said thermal resistance adjuster is mounted to a radiation fin so as to cut cooling air from said integrated circuit device, said radiation fin being shaped in a plate-like form and forming said heat sink, and said thermal resistance adjuster having a comb-like shape.

15. The method defined in claim 14, wherein said thermal resistance adjuster is mounted perpendicularly to a radiation surface of said radiation fin.

16. The method defined in claim 15, wherein said thermal resistance adjuster is mounted to said radiation fin so as to be variable in the blowing direction of said cooling air.

17. The method defined in claim 15, wherein said thermal resistance adjuster is mounted at a predetermined angle with respect to the mounting direction of said radiation fin.

18. The method defined in claim 15, wherein said heat sink includes a plurality of radiation fins and is shaped in a slit-like form to realize a low thermal resistance.

19. The method defined in claim 14, wherein said thermal resistance adjuster is mounted to said radiation fin so as to be variable in the blowing direction of said cooling air.

20. The method defined in claim 19, wherein said thermal resistance adjuster is mounted at a predetermined angle with respect to the mounting direction of said radiation fin.

21. The method defined in claim 19, wherein said heat sink includes a plurality of radiation fins and is shaped in a slit-like form to realize a low thermal resistance.

22. The method defined in claim 14, wherein said thermal resistance adjuster is mounted at a predetermined angle with respect to the mounting direction of said radiation fin.

23. A method of using a thermal-resistance variable heat sink structure, said method comprising the steps of using a thermal resistance adjuster for an inspection and then disassembling said thermal resistance adjuster, said thermal resistance adjuster being disposed on a heat sink to cool an integrated circuit device, said thermal resistance adjuster being formed of a material having a thermal resistance equal to or more than that of said heat sink, wherein said thermal resistance adjuster is mounted to a radiation fin so as to cut cooling air from said integrated circuit device, said radiation fin being shaped in a plate-like form and forming said heat sink, and wherein said thermal resistance adjuster is rotatably mounted on the middle portion of the radiation surface of said radiation fin.

24. The method defined in claim 14, wherein said heat sink includes a plurality of radiation fins and is shaped in a slit-like form to realize a low thermal resistance.

25. A method of using a thermal-resistance variable heat sink structure, said method comprising the steps of using a thermal resistance adjuster for an inspection and then disassembling said thermal resistance adjuster, said thermal resistance adjuster being disposed on a heat sink to cool an integrated circuit device, said thermal resistance adjuster being formed of a material having a thermal resistance equal to or more than that of said heat sink, wherein said thermal resistance adjuster is rotatably mounted on the middle portion of the radiation surface of said radiation fin.

26. The method defined in claim 25, wherein said heat sink is shaped in a slit-like form to realize a low thermal resistance.

* * * * *